(12) United States Patent
Sporer

(10) Patent No.: US 8,233,279 B2
(45) Date of Patent: Jul. 31, 2012

(54) WEDGE LOCK FOR USE WITH A SINGLE BOARD COMPUTER AND METHOD OF ASSEMBLING A COMPUTER SYSTEM

(75) Inventor: Bernd Sporer, Bobingen (DE)

(73) Assignee: GE Intelligent Platforms, Inc., Charlottesville, VA (US)

( * ) Notice: Subject to any disclaimer, the term of this patent is extended or adjusted under 35 U.S.C. 154(b) by 58 days.

(21) Appl. No.: 12/939,208

(22) Filed: Nov. 4, 2010

(65) Prior Publication Data

US 2012/0113589 A1 May 10, 2012

(51) Int. Cl.
*H05K 7/20* (2006.01)
(52) U.S. Cl. .................. 361/704; 361/719; 361/720
(58) Field of Classification Search .................. None
See application file for complete search history.

(56) References Cited

U.S. PATENT DOCUMENTS

| | | | | |
|---|---|---|---|---|
| 4,909,752 A * | 3/1990 | Hallum et al. | ................ | 439/325 |
| 4,994,937 A | 2/1991 | Morrison | | |
| 5,141,592 A * | 8/1992 | Shaposka et al. | ............ | 156/515 |
| 5,200,882 A | 4/1993 | Blomquist | | |
| 5,220,485 A * | 6/1993 | Chakrabarti | .................. | 361/720 |
| 5,262,587 A * | 11/1993 | Moser | ......... | 174/15.1 |
| 5,859,764 A * | 1/1999 | Davis et al. | ................... | 361/704 |
| 5,892,658 A * | 4/1999 | Urda et al. | .................... | 361/704 |
| 6,212,075 B1 | 4/2001 | Habing et al. | | |
| 6,246,582 B1 | 6/2001 | Habing et al. | | |
| 6,621,706 B2 * | 9/2003 | Tzlil et al. | .................... | 361/719 |
| 6,678,159 B1 | 1/2004 | Barcley | | |
| 2003/0223197 A1* | 12/2003 | Hulan et al. | ................. | 361/719 |

* cited by examiner

*Primary Examiner* — Gregory Thompson
(74) *Attorney, Agent, or Firm* — GE Global Patent Operation; Catherine J. Toppin

(57) ABSTRACT

A wedge lock for use with a single board computer includes a first portion configured to move in a first direction and a second portion configured to move in a plurality of directions in response to the movement of the first portion and to facilitate securing the single board computer in an operating environment and to facilitate conduction cooling of the single board computer.

20 Claims, 7 Drawing Sheets

WEDGE LOCK FOR USE WITH A SINGLE BOARD COMPUTER AND METHOD OF ASSEMBLING A COMPUTER SYSTEM

BACKGROUND OF THE INVENTION

The embodiments described herein relate generally to single board computers and, more particularly, to securing a single board computer in an operating environment and providing enhanced conductive cooling of the single board computer.

As electrical assemblies, such as computers, become more densely populated with heat-generating components, such as processors integrated circuits, transistors, and other electronic components, component overheating becomes more likely. This increased likelihood of overheating contributes to reducing the lifespan of such assemblies and/or becomes a limiting factor in reliability, possible maximum operating temperature, and/or size of such assemblies.

Rack-mounted circuit boards, such as those that may be used in known electrical assemblies, may generally be classified as either a conduction cooled circuit board or a convection cooled circuit board. At least some known conduction cooled circuit boards include a cooling plate that is positioned on one surface of the circuit board and in contact with components mounted, such as soldered, on the circuit board. A heat management layer extends at the edges of the circuit board to provide conduction surfaces that are arranged to contact heat sinks. More specifically, the heat management layer is a portion of the cooling plate that facilitates thermal conduction of heat generated by the components to the heat sinks.

Many circuit boards are used in high-stress environments, such as environments with high shock, vibration, and/or heat. Moreover, many such circuit boards still require high availability and reliability. At least some known convection cooled circuit boards use fans or similar elements to blow cooling air onto the circuit boards to remove heat. However, these fans can be shaken by shock and/or vibration, or may overheat similar to other electrical components. In addition, fans can collect dust and dirt, which lessens the air output. At least some known conduction cooled circuit boards use wedge locks to secure the circuit boards within an operating environment and to conduct heat away from the circuit boards. However, at least some known wedge locks have small contact surface areas with the heat management layer and/or a thermal reference surface of the operating environment, which focuses the heat into a narrow thermal path that increases the thermal resistance, thereby making such wedge locks less efficient in conducting the heat away from the circuit boards.

BRIEF DESCRIPTION OF THE INVENTION

In one aspect, a wedge lock for use with a single board computer includes a first portion configured to move in a first direction and a second portion configured to move in a plurality of directions in response to the movement of the first portion and to facilitate securing the single board computer in an operating environment and to facilitate conduction cooling of the single board computer.

In another aspect, a single board computer includes a printed circuit board (PCB), a cooling plate positioned with respect to the PCB, and a wedge lock configured to secure the single board computer in an operating environment. The wedge lock includes a first portion configured to move in a first direction and a second portion configured to move in a plurality of directions in response to the movement of the first portion and to facilitate conduction cooling of the single board computer.

In another aspect, a method is provided for assembling a computer system that includes a single board computer, wherein the single board computer includes a wedge lock having a first portion and a second portion. The method includes positioning the single board computer with respect to a thermal reference surface of the computer system, and adjusting the first portion of the wedge lock in a first direction to impart a force on the second portion of the wedge lock that causes the second portion to move in a plurality of directions in order to secure the single board computer within the computer system and to facilitate conduction cooling of the single board computer.

DETAILED DESCRIPTION OF THE INVENTION

Exemplary embodiments of apparatuses for use in providing conduction cooling to an electronic device, such as a single board computer, are described herein. The embodiments described herein facilitate optimizing an area of one or more thermal paths through which heat is transferred away from the electronic device by increasing a surface area of direct contact between a wedge lock and a card guide that provides conductive heat transfer away from the electronic device and secures the electronic device within an operating environment. Increasing the surface area of direct contact also facilitates optimizing heat transfer away from the electronic device by reducing a thermal resistance of the cooling components of the electronic device and the card guide.

As used herein, the term "heat" may refer to any suitable heat-related measurement. For example, "heat" may be measured as an amount of energy in, for example, Joules. Alternatively, "heat" may be measured as an amount of heat that is transferred from one surface to another in a unit of time, i.e., heat flux, and expressed in, for example, Watts. The examples above are exemplary only, and thus are not intended to limit in any way the definition and/or meaning of the term "heat."

Figure 1:
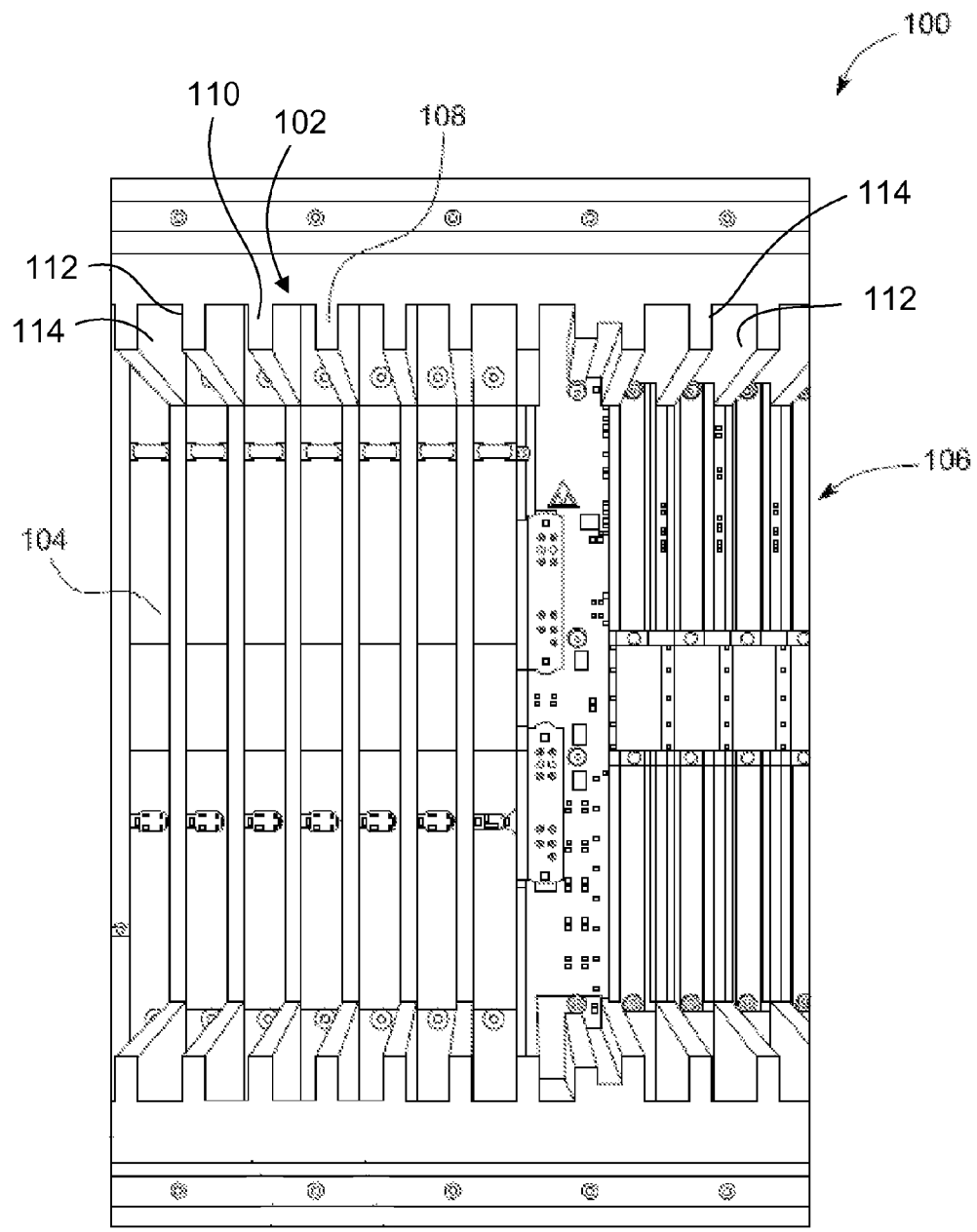
FIG. 1 is a partial top view of an exemplary operating environment of a conduction cooled single board computer.

FIG. 1 is a partial top view of an exemplary operating environment 100 of a conduction cooled single board computer (not shown). In some embodiments, operating environment 100 is suitable for harsh environments that can produce high levels of shock, vibration, and heat, such as military, avionics, and/or rail environments. Operating environment 100 includes a plurality of slots 102 each sized to receive a respective single board computer therein. Each slot 102 includes one or more first connectors 104 that are connected to a backplane 106 of operating environment 100. Moreover, each slot 102 includes a plurality of card guides, such as a first card guide 108 and a second card guide 110 that is opposite first card guide 108. First and second card guides 108 and 110 facilitate conduction cooling of a single board computer by way of a thermal reference surface and a wedge lock surface. For example, as shown in FIG. 1, first card guide 108 includes a thermal reference surface 112 that facilitates conduction cooling via a thermal path, and second card guide 110 includes a wedge lock surface 114 that facilitates conduction cooling via another thermal path. In an alternative embodiment, first card guide 108 includes wedge lock surface 114 and second card guide 110 includes thermal reference surface 112. In the exemplary embodiment, the single board computer is cooled only via conduction cooling and not via air movement. Accordingly, in the exemplary embodiment, all heat generated by the single board computer is transferred to the ambient or to any other cooling environment by first and second card guides 108 and 110 via thermal reference surface 112 and wedge lock surface 114. However, alternative embodiments may include other methods of cooling the single board computer in addition to conduction cooling. Wedge lock surface 114 further facilitates securing a single board computer within slot 102 as described in greater detail below.

Figure 2:
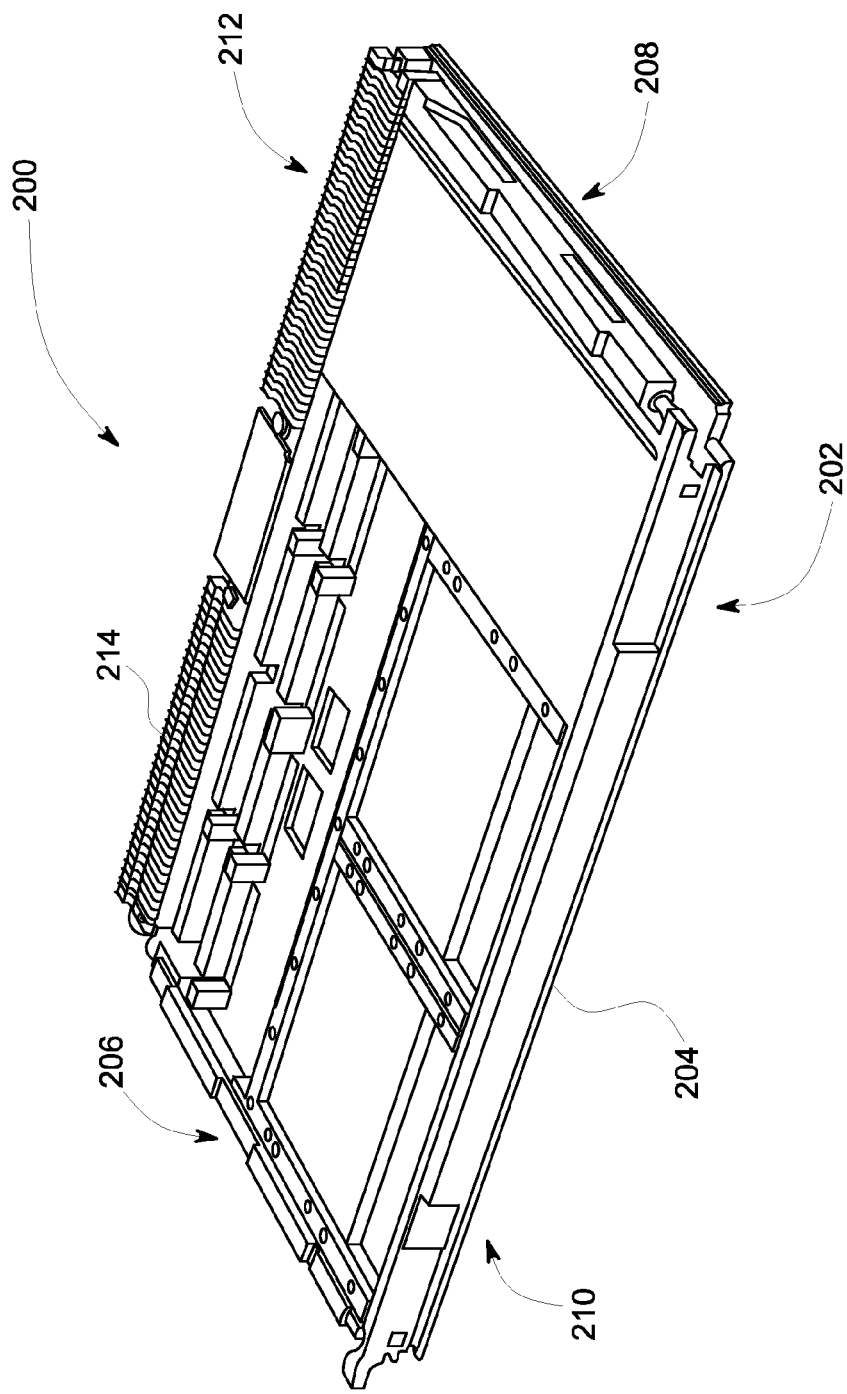
FIG. 2 is a perspective view of an exemplary single board computer that may be used with the operating environment shown in FIG. 1.

FIG. 2 is a perspective view of an exemplary single board computer 200 that may be used with operating environment 100 (shown in FIG. 1). In the exemplary embodiment, computer 200 includes a cooling plate 202 and a printed circuit board (PCB) 204 that is positioned within cooling plate 202. Cooling plate 202 includes a first side 206 and an opposite second side 208. First and second sides 206 and 208 each includes a wedge lock (not shown in FIG. 2) that facilitates securing computer 200 within operating environment 100. More specifically, the wedge locks facilitate securing computer 200 within a designated slot 102 (shown in FIG. 1) using first and second card guides 108 and 110 (shown in FIG. 1). Moreover, the wedge locks facilitate transferring heat generated by PCB 204 out of computer 200 to first and second card guides 108 and 110. In the exemplary embodiment, cooling plate 202 also includes a front end 210 and an opposite rear end 212. Second connectors 214 are provided along rear end 212 and are configured to couple to first connectors 104 (shown in FIG. 1) for use in transmitting power and data signals between operating environment 100 and computer 200.

Figure 3:
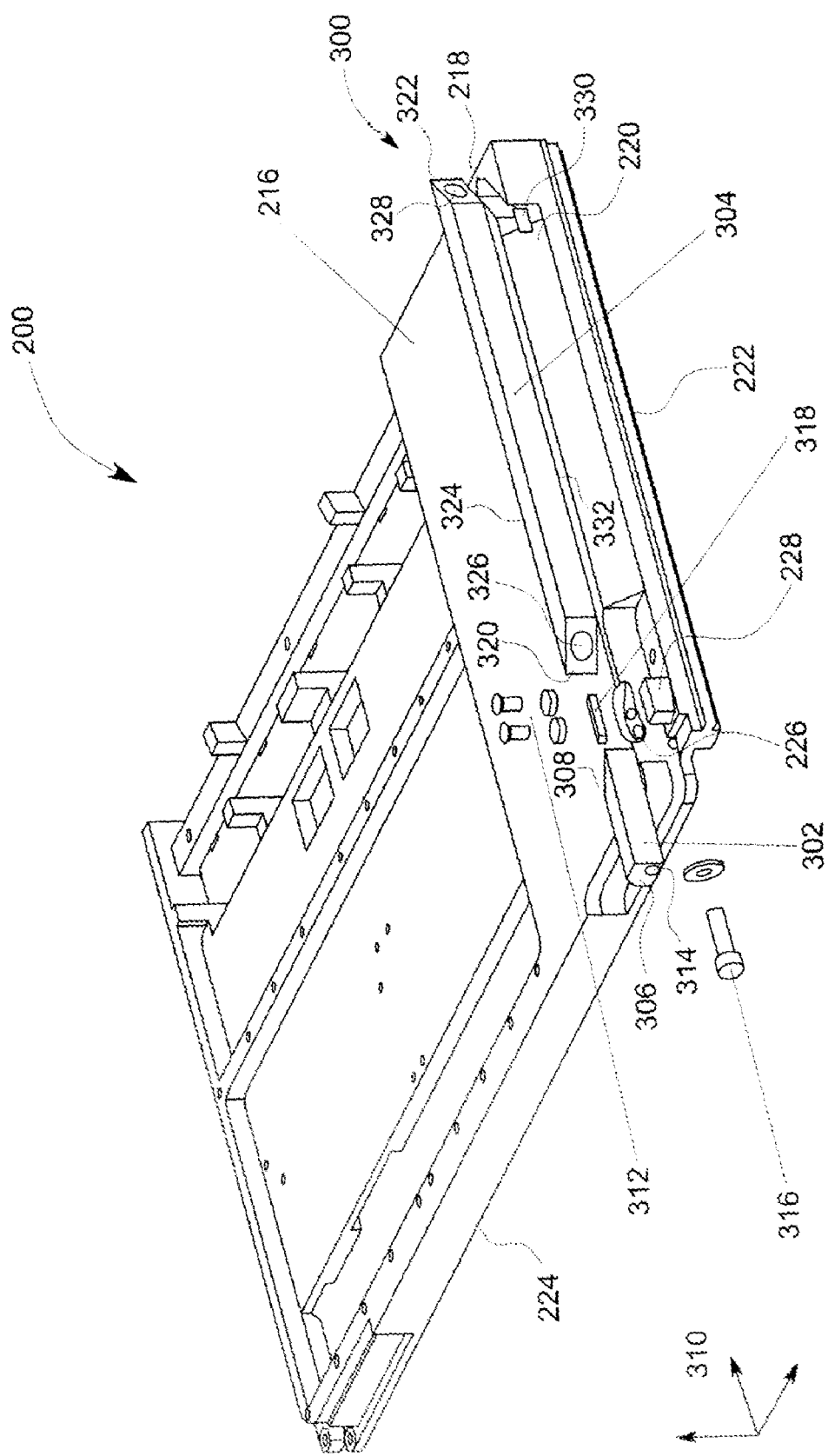
FIG. 3 is a perspective schematic diagram of the single board computer shown in FIG. 2 and a partially exploded view of an exemplary wedge lock that may be used with the single board computer.

FIG. 3 is a perspective schematic diagram of single board computer 200 and a partially exploded view of an exemplary wedge lock 300 that may be used with computer 200. In the exemplary embodiment, cooling plate 202 extends at least partially along a top surface 216 of computer 200. Cooling plate 202 facilitates transferring heat away from PCB 204 (shown in FIG. 2) to maintain a desired operating temperature of computer 200. In the exemplary embodiment, cooling plate 202 includes an end wedge portion 218 and an outer edge surface 220. Moreover, a heat management layer 222 extends at least partially along a bottom surface 224 of computer 200. More specifically, heat management layer 222 is a portion of cooling plate 202 that is positioned in contact with an inner surface (not shown) of first and second card guides 108 and 110 (shown in FIG. 1) to facilitate transferring the heat to first and second card guides 108 and 110 and into the ambient or other cooling environment.

In the exemplary embodiment, wedge lock 300 includes a first portion 302 and a second portion 304. First portion 302 includes a first end 306 and an opposite second end 308, and is positioned near front end 210 (shown in FIG. 2) of computer 200. First portion 302 is movably coupled to cooling plate 202, and is configured to move in a first direction, such as along a first axis 310. For example, one or more apertures (not shown) are formed in a bottom surface (not shown) of first portion 302 and are each sized to receive respective fastening mechanisms 312 therein. In addition, cooling plate 202 includes one or more apertures 226 that are each positioned beneath respective apertures of first portion 302 and sized to receive a respective fastening mechanism 312 therein to facilitate coupling first portion 302 to cooling plate 202. Cooling plate 202 also includes a block portion 228 that is sized to be inserted into an opening (not shown) formed in the bottom surface of first portion 302. Block portion 228 facilitates limiting an amount of movement of first portion 302 in the first direction. First end 306 of first portion 302 includes an opening 314 formed therein. Opening 314 is sized to receive a screw 316 therein. First portion 302 is moved in the first direction due to a force induced on first portion 302 when screw 316 is rotated about first axis 310. Second end 308 of first portion 302 also includes an opening (not shown) that is sized to receive a first guard pin 318 therein to facilitate securing second portion 304 within wedge lock 300.

In the exemplary embodiment, second portion 304 includes a first end 320 and an opposite second end 322 with a body 324 defined therebetween. First end 320 is at least partially flush in contact with second end 308 of first portion 302. Moreover, second end 308 and first end 320 are each formed at the same angle. An opening 326 is defined in first end 320 and is sized to receive first guard pin 318 therein. Opening 326 is shaped to guide movement of second portion 304 as described in greater detail below. Second end 322 also includes an opening 328 that is sized to receive a second guard pin 330. Second guard pin 330 is also inserted into end wedge portion 218 to similarly guide movement of second portion 304. A bottom surface 332 of second portion 304 is at least partially flush in contact with outer edge surface 220 to facilitate transferring heat generated by PCB 204 to second portion 304.

Figure 4:
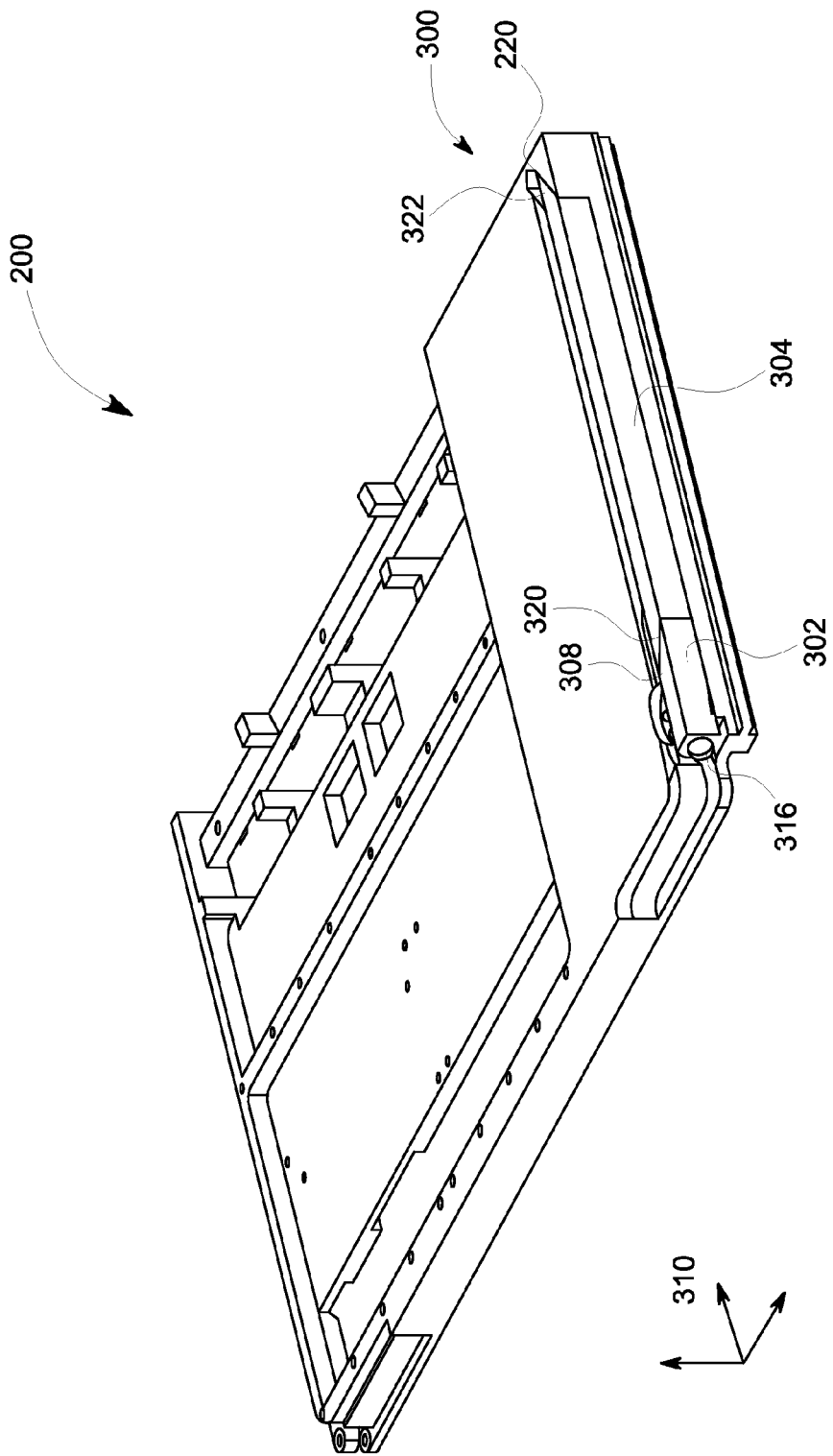
FIG. 4 is a perspective schematic diagram of the single board computer shown in FIG. 2 when the wedge lock shown in FIG. 3 is in a first position.
Figure 5:
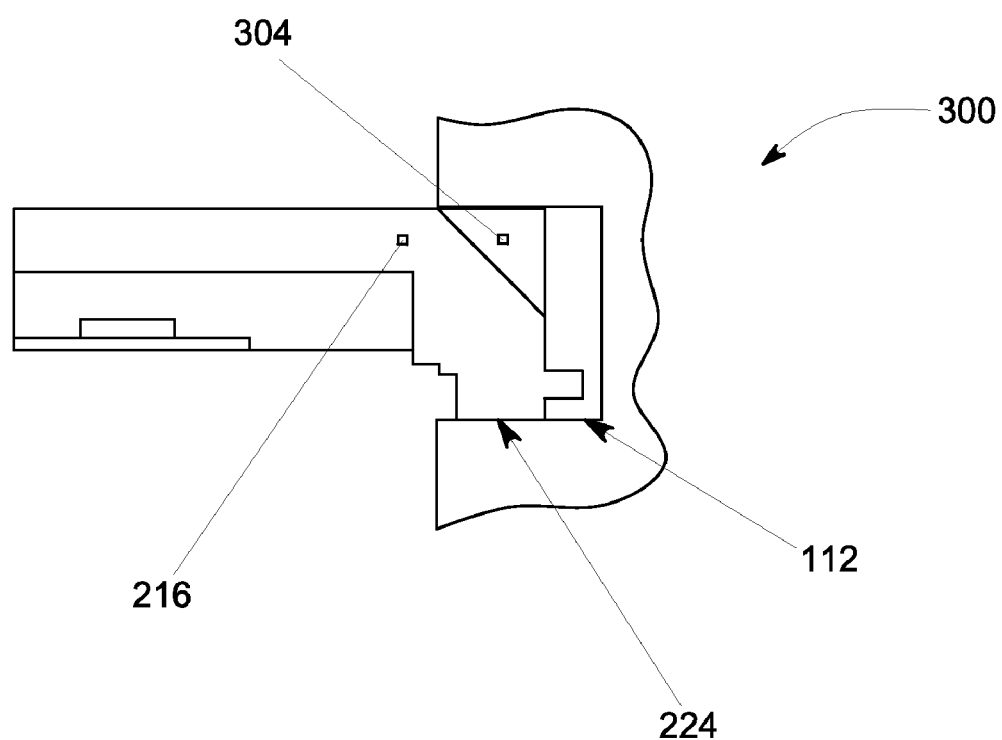
FIG. 5 is a side schematic diagram of a second side of the single board computer shown in FIG. 2 when the wedge lock shown in FIG. 3 is in a first position.

FIG. 4 is a perspective schematic diagram of single board computer 200, and FIG. 5 is a side schematic diagram of second side 208 of computer 200. Specifically, FIGS. 4 and 5 illustrate a first or resting position of wedge lock 300, wherein screw 316 has not been rotated about first axis 310. As shown in FIGS. 4 and 5, first portion second end 308 and second portion first end 320 are substantially flush. Second portion second end 322 is positioned with respect to end wedge portion 218 such that a gap is defined therebetween. In addition, bottom surface 332 and outer edge surface 220 (both shown in FIG. 3) are substantially flush.

Figure 6:
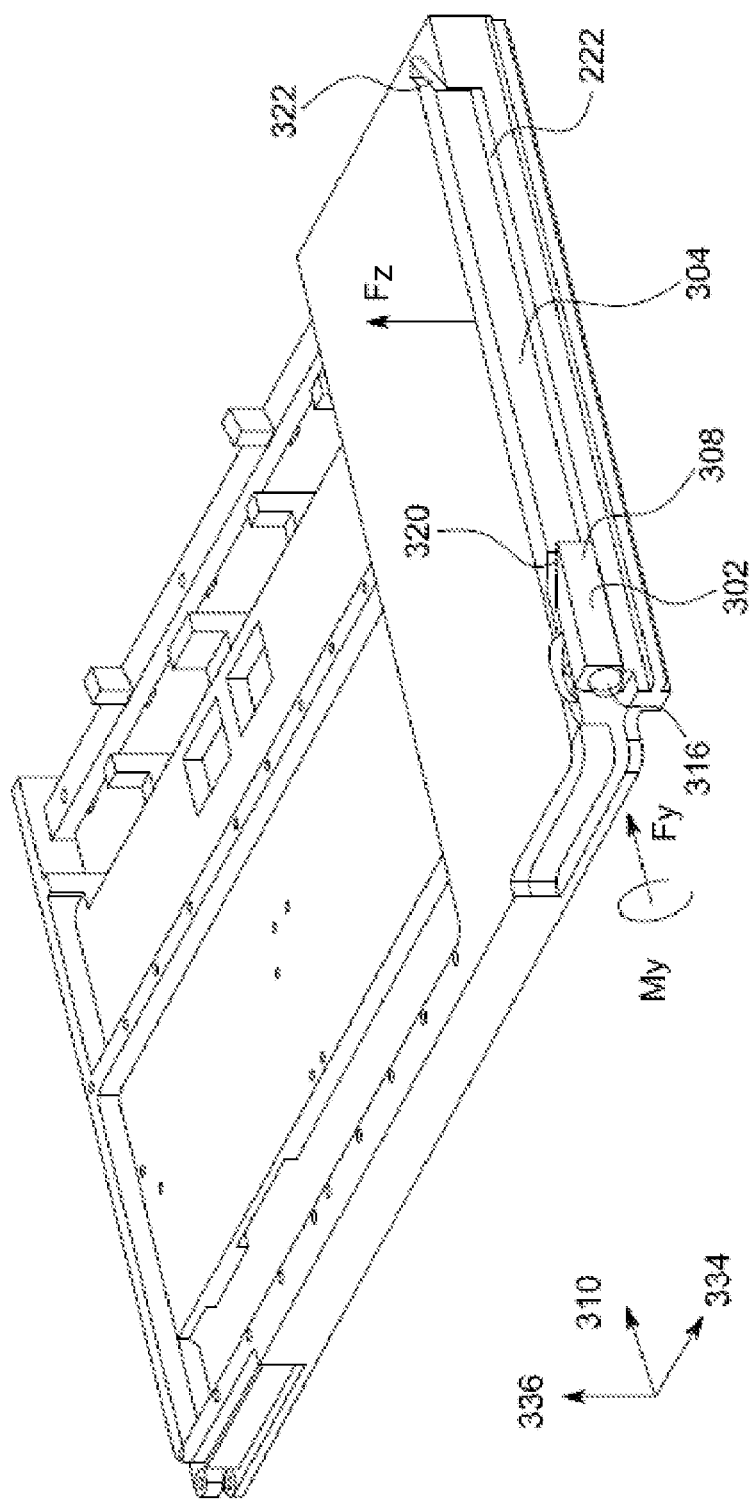
FIG. 6 is a perspective schematic diagram of the single board computer shown in FIG. 2 when the wedge lock shown in FIG. 3 is in a second position.
Figure 7:
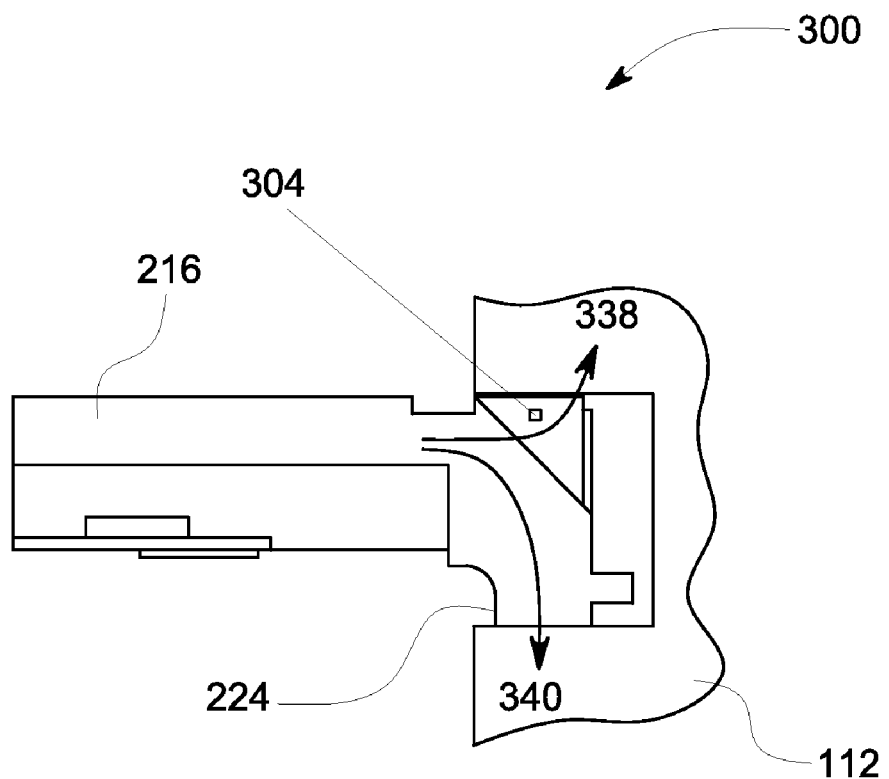
FIG. 7 is a side schematic diagram of a second side of the single board computer shown in FIG. 2 when the wedge lock shown in FIG. 3 is in a second position.

FIG. 6 is a perspective schematic diagram of single board computer 200, and FIG. 7 is a side schematic diagram of second side 208 of computer 200. Specifically, FIGS. 6 and 7 illustrate a second or clamped position of wedge lock 300, wherein screw 316 has been rotated about first axis 310 by a force moment My. Rotating screw 316 about first axis 310 causes first portion 302 to move in the first direction with a first force Fy and induce a second force Fz on second portion 304. In the exemplary embodiment, the second force Fz is a clamping force along a second axis 334 that is perpendicular to first axis 310. For example, the second force Fz is a force vector that includes a plurality of components such as a first component along first axis 310, a second component along second axis 334, and a third component along third axis 336. The sum of the components results in a magnitude of the second force Fz and a direction of the second force Fz. Moreover, the second force Fz causes second portion 304 to move in a plurality of directions, including in the first direction along first axis 310 due to the first force vector component, in a second direction along second axis 334 due to the second force vector component, and in a third direction along a third axis 336 that is perpendicular to first axis 310 and second axis 334 due to the third force vector component.

Specifically, the movement of first portion 302 causes second portion 304 to move in the first direction along first axis 310. Moreover, the movement of first portion 302 causes second portion 304 to move in the second direction along second axis 334 due to the opposing angled shapes of first portion second end 308 and second portion first end 320, and similarly due to the opposing angled shapes of second portion second end 322 and end wedge portion 218. In addition, second end 322 moves with respect to end wedge portion 218 to reduce the gap therebetween such that, in some embodiments, at least a portion of second end 322 is substantially flush with at least a portion of end wedge portion 218. The movement of second portion 304 in the second direction is also due to the opposing angled shapes of bottom surface 332 (shown in FIG. 3) and outer edge surface 220. Furthermore, the movement of second portion in the third direction along third axis 336 is due to the opposing angled shapes of bottom surface 332 and outer edge 220.

In the exemplary embodiment, single board computer 200 and, more specifically, wedge lock 300 provide multiple thermal paths for heat to be conducted away from PCB 204 (shown in FIG. 2) to first card guide 108 (shown in FIG. 1) and second card guide 110. A first thermal path 338 includes cooling plate 202 and second portion 304. A second thermal path 340 includes only cooling plate 202. Enabling second portion 304 to directly contact second card guide 110 directly provides a greater surface area of contact between wedge lock 300 and second card guide 110 to facilitate enhancing heat transfer away from PCB 204. Moreover, the generally triangular shape of second portion body 324 provides an optimized profile area, such as an increased profile area, between cooling plate 202 and heat management layer 222, thereby enhancing heat transfer away from PCB 204. Each of these factors also optimizes, such as reduces, thermal resistance of computer 200 and wedge lock 300, which further enhances heat transfer away from PCB 204.

Exemplary embodiments of apparatuses for use in conduction cooling a single board computer are described above in detail. The apparatuses are not limited to the specific embodiments described herein but, rather, operations of the methods and/or components of the system and/or apparatus may be utilized independently and separately from other operations and/or components described herein. Further, the described operations and/or components may also be defined in, or used in combination with, other systems, methods, and/or apparatus, and are not limited to practice with only the systems, methods, and storage media as described herein.

The order of execution or performance of the operations in the embodiments of the invention illustrated and described herein is not essential, unless otherwise specified. That is, the operations may be performed in any order, unless otherwise specified, and embodiments of the invention may include additional or fewer operations than those disclosed herein. For example, it is contemplated that executing or performing a particular operation before, contemporaneously with, or after another operation is within the scope of aspects of the invention.

When introducing elements of aspects of the invention or embodiments thereof, the articles "a," "an," "the," and "said" are intended to mean that there are one or more of the elements. The terms "comprising," "including," and "having" are intended to be inclusive and mean that there may be additional elements other than the listed elements.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A wedge lock for use with a single board computer, said wedge lock comprising:
   a first portion configured to move in a first direction; and
   a second portion configured to move in a a second direction in response to the movement of said first portion, wherein the second portion is further configured to move in a third direction that is perpendicular to the first and second directions to facilitate securing the single board computer in an operating environment and conduction cooling of the single board computer.

2. A wedge lock in accordance with claim 1, wherein said first portion comprises a first end and a second end, said first end defining an opening sized to receive a fastening mechanism therein to cause said first portion to move in the first direction.

3. A wedge lock in accordance with claim 2, wherein the movement of said first portion induces a force on said second portion, the force including a first force vector component that causes said second portion to move in the first direction.

4. A wedge lock in accordance with claim 3, wherein said second portion comprises a first end and a second end, said second portion first end at least partially contacting said first portion second end, the force induced on said second portion further including a second force vector component that causes said second portion to move in the third direction perpendicular to the first direction and second directions.

5. A wedge lock in accordance with claim 4, wherein the single board computer includes a cooling plate including an end wedge portion, the second force vector component of the force causing said second portion to move in the second direction such that said second portion second end at least partially contacts the end wedge portion, the force induced on said second portion further including a third force vector component that causes said second portion to move in the third direction perpendicular to the first direction and the second direction.

6. A wedge lock in accordance with claim 5, wherein the cooling plate further includes an outer edge surface, said second portion further comprising a bottom surface at least partially contacting the outer edge surface, the third force vector component of the force induced on said second portion causing said second portion to move in the third direction along the outer edge surface.

7. A wedge lock in accordance with claim 6, wherein the movement of said second portion in the third direction facilitates securing the single board computer in the operating environment.

8. A single board computer comprising:
a printed circuit board (PCB);
a cooling plate positioned with respect to said PCB; and
a wedge lock configured to secure said single board computer in an operating environment, said wedge lock comprising:
a first portion configured to move in a first direction; and
a second portion configured to move in a second direction response to the movement of said first portion, wherein the second portion is further configured to move in a third direction that is perpendicular to the first and second directions to facilitate conduction cooling of said single board computer.

9. A single board computer in accordance with claim 8, wherein said wedge lock provides a first thermal path that enables heat produced by said PCB to be removed, the first thermal path including said cooling plate and said second portion.

10. A single board computer in accordance with claim 9, wherein said wedge lock provides a second thermal path that enables heat produced by said PCB to be removed, the second thermal path including said cooling plate.

11. A single board computer in accordance with claim 8, wherein said first portion is configured to move in the first direction to induce a force on said second portion, the force including a first force vector component that causes said second portion to move in the first direction.

12. A single board computer in accordance with claim 11, wherein said second portion comprises a first end and a second end, said first end at least partially contacting said first portion, the force induced on said second portion further including a second force vector component that causes said second portion to move in the second direction perpendicular to the first direction.

13. A single board computer in accordance with claim 12, wherein said cooling plate comprises an end wedge portion, the second force vector component of the force causing said second portion to move in the second direction such that said second portion second end at least partially contacts said end wedge portion, the force induced on said second portion further including a third force vector component that causes said second portion to move in the third direction perpendicular to the first direction and the second direction.

14. A single board computer in accordance with claim 13, wherein said cooling plate further comprises an outer edge surface, said second portion further comprising a bottom surface at least partially contacting said outer edge surface, the third force vector component of the force induced on said second portion causing said second portion to move in the third direction along said outer edge surface.

15. A single board computer in accordance with claim 14, wherein the movement of said second portion in the third direction facilitates securing said single board computer in the operating environment.

16. A method of assembling a computer system that includes a single board computer, the single board computer including a wedge lock having a first portion and a second portion, said method comprising:
positioning the single board computer with respect to a thermal reference surface of the computer system; and
adjusting the first portion of the wedge lock in a first direction to impart a force on the second portion of the wedge lock that causes the second portion to move in a in a second direction, wherein the second portion is further configured to move in a third direction that is perpendicular to the first and second directions, in order to secure the single board computer within the computer system and to facilitate conduction cooling of the single board computer.

17. A method in accordance with claim 16, wherein adjusting the first portion comprises rotating a screw about a first axis that extends in the first direction such that the first portion imparts the force on the second portion, the force including a first force vector component that causes the second portion to move in the first direction.

18. A method in accordance with claim 17, wherein adjusting the first portion comprises rotating a screw about a first axis that extends in the first direction such that the first portion imparts the force on the second portion, the force further including a second force vector component that causes the second portion to move in the second direction perpendicular to the first direction.

19. A method in accordance with claim 18, wherein adjusting the first portion further comprises rotating the screw about the first axis such that the first portion imparts the force on the second portion, the force further including a third force vector component that causes the second portion to move in a third direction perpendicular to the first direction and the second direction.

20. A method in accordance with claim 16, wherein the single board computer further includes a cooling plate, said positioning the single board computer with respect to a thermal reference surface facilitates providing a first thermal path that includes the cooling plate and the second portion of the wedge lock and a second thermal path that includes only the cooling plate.

* * * * *